United States Patent
Wade

(10) Patent No.: US 6,780,755 B2
(45) Date of Patent: Aug. 24, 2004

(54) GAS DOME DIELECTRIC SYSTEM FOR ULSI INTERCONNECTS

(75) Inventor: Thomas E. Wade, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 10/266,179

(22) Filed: Oct. 7, 2002

(65) Prior Publication Data

US 2003/0104688 A1 Jun. 5, 2003

Related U.S. Application Data

(63) Continuation-in-part of application No. 09/716,737, filed on Nov. 20, 2000, now abandoned.
(60) Provisional application No. 60/166,188, filed on Nov. 18, 1999.

(51) Int. Cl.[7] .......................................... H01L 21/4763
(52) U.S. Cl. ...................... 438/622; 438/421; 438/422; 438/619; 438/623; 438/624; 438/780
(58) Field of Search .............................. 438/421, 422, 438/618, 619, 622, 623, 624, 780; 257/276, 410, 522

(56) References Cited

U.S. PATENT DOCUMENTS

| | | | | |
|---|---|---|---|---|
| 5,034,799 A | * | 7/1991 | Tomita et al. | 257/758 |
| 5,413,962 A | * | 5/1995 | Lur et al. | 438/619 |
| 5,900,668 A | * | 5/1999 | Wollesen | 257/522 |
| 6,165,890 A | * | 12/2000 | Kohl et al. | 438/619 |
| 6,184,121 B1 | * | 2/2001 | Buchwalter et al. | 438/622 |

OTHER PUBLICATIONS

Nura: A Feasible, Gas–Dielectric Interconnect Process 1996 Symposium on VLSI Technology Digest of Technical Papers, pp. 82–83.

Dual Damascene Aluminum for 1–Gbit DRAMS, Nov. 1998 Solid State Technology, pp. 37–38 & 43–44.

Use of Gas as Low–k Interlayer Dielectric in LSI's: Demonstration of Feasibility, Nov. 1997 IEEE Transactions On Electron Devices, vol. 44, No. 11., pp. 1965–1971.

The Low–K Limit: A Gas Dielectric Interconnect Process, M.B. Anand, Toshiba Corporation, 8 Shinsugita–cho, Isogo–Ku, Yokohama.

Air–Gaps in 0.3 $\mu$m Electrical Interconnections, Dec. 2000 IEEE Electron Device Letters, vol. 21, No. 12.

* cited by examiner

*Primary Examiner*—Maria Guerrero
(74) *Attorney, Agent, or Firm*—Howard & Howard

(57) ABSTRACT

A method of forming a multilevel conductor structure for ULSI circuits is provided. The structure includes a substrate having a plurality of dielectric supports extending from the substrate to support conductor layers. A removable material is deposited progressively on the substrate. An insulating 'dome' is formed over the conductor envelope and the material. Openings are provided through the dome for removing the material. The evacuated 'dome envelope' is filled with a near-unity dielectric constant gas or liquid at or above atmospheric pressure to enhance heat removal. The openings are sealed to provide a dielectric medium around the conductors within the envelope. Metal conductors within the envelope electrically connect active devices to other active regions as well as to the external environment. Additionally, 'thermal columns' extending through the envelope aid in heat removal, and inorganic 'support blocks' extending from the substrate to the dome provide mechanical integrity for external wire bonding.

17 Claims, 9 Drawing Sheets

GAS DOME DIELECTRIC SYSTEM FOR ULSI INTERCONNECTS

RELATED APPLICATIONS

This application is a continuation-in-part of U.S. patent application Ser. No. 09/716,737, which was filed on Nov. 20, 2000, now abandoned, and claims priority to and the benefits of co-pending provisional application No. 60/166,188, which was filed on Nov. 18, 1999.

FIELD OF THE INVENTION

The present invention relates to a method of fabricating electrical conductors for an integrated circuit (IC) having improved electrical properties. The invention effectively reduces the dielectric constant of insulating material between selected IC conductors on the same level (intralevel) or between conductors on superposed levels (interlevel) in VLSI or ULSI circuits, hence dramatically reducing the coupling capacitance between conductor levels. Realization of this method and structure utilizes an enclosed near-unity dielectric constant gas or liquid material, the composition and pressure of which can be selected.

BACKGROUND OF THE INVENTION

There is a need to replace the inorganic/organic insulating material used to isolate metal conductors in ultra large scale integrated circuits (ULSI) in order to reduce the signal RC delay, resulting in a faster (higher frequency) circuit performance. The term 'RC delay' stands for 'resistance-capacitance delay' and is a function of the type of metal conductor used (resistance component) and the type of insulating material used to isolate the metal conductors (capacitive component). The lower the 'dielectric constant', k, of the insulating material, the lower the capacitive component. An ideal gas has a dielectric constant equal to 1.0, whereas most inorganic/organic insulating materials currently used in the semiconductor industry have a dielectric constant of 2.5–3.0 (organic polymers) to 4.3 (inorganic silicon dioxide), or even higher (silicon nitride). Historically, silicon dioxide has been used as the insulating material for on-chip ULSI interconnect purposes. However, with the need to make integrated circuits smaller and faster (resulting in faster computers, etc.), there has been a concerted effort by the semiconductor industry to find a replacement for silicon dioxide. A number of "organic" insulating materials having a lower dielectric constant are being considered, however, most of these materials have reliability problems.

The RC delay associated with interconnect is rapidly becoming the limiting factor in realizing high speed integrated circuits with design rules below 0.25 microns. See *National Technology Roadmap for Semiconductors: Technology Needs*. Published by Semiconductor Industry Assoc., pp 99–110, 1997.

As packing density increases, the cross-sectional area of interconnect lines decreases causing the resistance to length ratio to dramatically increase. The adoption of copper as the conductor of choice can improve the resistance component by almost a factor of two over that of aluminum (from 3.0 to 1.7 micro-ohm-cm resistivity). However, a dramatic reduction in the dielectric constant of the intermetal dielectric material over that of silicon dioxide (k=4.1) is also needed to address the capacitive component for future high speed circuitry.

A reduction in interconnect line capacitance (resulting from a reduction of dielectric constant) can reduce signal propagation delay, reduce power consumption at high frequencies and reduce cross coupling between conductors (cross-talk and noise). Another significant benefit of reducing RC delay is to reduce process complexity (i.e., 12 levels of metal using Al—SiO2 versus 6 levels of metal using Cu-low k at 0.13 microns design rules), and hence improves reliability and yield while reducing cost. A reduction of wire capacitance can also provide an increased degree of design freedom; the designer can use the reduction in capacitance to either improve speed or reduce power. See G. A. Sai-Halasz, *Proc IEEE*, vol 83, no. 1, p 20, 1995. Currently, there is a wide variety of organic and inorganic materials bring investigated as potential candidates for low-k intermetal dielectrics. See D. S. Armbrust, D. Kumar, *Short Course on Dielectrics for ULSI Multilevel Interconnection Visuals Booklet*, DUMIC, Santa Clara, Calif., Feb. 10, 1999. Also, procedures have been proposed to conduct comparative evaluations of these candidates in order to find the optimal material. See T. E. Wade, "Optimum Dielectric Selection Using a Weighted Evaluation Factor", *DUMIC*, pp 211–218, 1995 and *Semiconductor International*, pp 99–106, vol 38, no. 8, August, 1995. Many of these candidates exhibit severe reliability, manufacturability and/or process integration problems, especially the organic candidates.

Properties required for an acceptable intermetal dielectric material for use in ULSI interconnects include a) low dielectric constant (ideally k=1.0), b) high breakdown field strength (>2 MV/cm), c) low bulk leakage (resistivity>$10^{15}$ ohms/cm), d) low surface conductance (surface resistivity>$10^{15}$ ohms), e) low stress (compressive or weak tensile>30 Mpa), f) mechanical/chemical/thermal stability, g) no moisture absorption and/or permeability to moisture, h) process compatible (CMP/dual damascene/etc.), i) good thermal properties (high thermal conductivity, low TCE, stable), j) compatibility with environmental, health and safety requirements, etc. The National Semiconductor Roadmap for Semiconductors calls for dielectrics with k=2.5–3.0 for 0.18 micron devices and 2.0–2.5 at 0.15 micron devices. If a reliable unity-k dielectric system could be realized using conventional technological processes, a quantum step towards meeting Roadmap goals could be achieved.

The use of gas dielectrics offers many benefits, including: 1) optimal electrical properties (unity dielectric constant (k=1) for reduced RC delay/cross-talk/power consumption, high breakdown strength, low leakage, high volume and surface resistivity, no polarization effects, low ionic/contamination/migration effects, low mobile ion/charge trapping effects), 2) optimal mechanical properties (no shrinkage, no stress due to thermal intrinsic effects, no problems with adhesion, no defect density issues like pinhole density/particulates/cracks/seams/etch pits/etc., no gap fill problems, no planarization problems), 3) optimal chemical properties (resistant to corrosion, leaching & precipitation, no EHS issues), and 4) optimal design/processing characteristics (scalability, reduced complexity/cost/improved yield, no barriers needed, reduced overall cost-of-ownership, commercially available sub-processes).

To date, liquid dielectric materials have not been used as insulators in the fabrication of integrated circuits. However, current research may well result in liquid (or semi-liquid) dielectric materials having dielectric properties similar to those mentioned above for gases but with superior thermal conduction properties.

The most significant benefits of utilizing gas (and possibly liquid) dielectrics are reduced cost, improved yield and higher speed circuitry. Also, in general the greatest benefit for unity-k dielectrics is where lines are at their minimum pitch.

SUMMARY OF THE INVENTION AND ADVANTAGES

A method of providing an electrically insulating medium in an enclosed envelope which contains multilevel metal conductors of an integrated circuit is disclosed. The method includes the step of providing a base substrate. The base substrate is formed of insulating material. Next, a plurality of discrete multilevel metal conductors are formed on and above the base substrate, and then a plurality of discrete support means are formed to extend upwardly from the base substrate to one or more conductor levels or between conductor levels. A selectively removable material is then deposited on the base substrate and around the support means and the metal conductor.

A dome layer of insulating material is then provided overlying the support means, the conductor levels, and the removable material. Once the dome layer is provided, access opening means are formed in the dome layer to communicate with the removable material. The removable material is then removed through the access opening means. The removable material is removed without interrupting the base substrate, the dome layer, the support means, and the metal conductors. As such, the envelope is defined between the base substrate and the dome layer and around the support means and the metal conductors such that the envelope is filled with a low dielectric constant material. Finally, the access opening means are sealed with conducting or insulating material as desired.

Ultimately, this invention provides a method and structure for providing a multilevel conductor system for ULSI circuitry having the following unique features:

1. Multilevel conductors within a 'domed envelope region' which are completely surrounded (top, bottom, and each side) by a near unity-k dielectric material.
2. All conductors within the 'domed envelope region' are held in place by a plurality of stanchions formed by inorganic insulating materials (except those penetrating the large inorganic support blocks under bonding pads).
3. The dielectric material contained within the 'domed envelope region' could be either:
   a) any non-intrusive near-unity-k gas, at a pressure that is below or above atmospheric pressure (i.e., for purposes of heat extraction, gases at pressures above atmospheric pressure are desirable).
   b) any non-intrusive near-unity-k liquid which possesses good electrical/mechanical/reliability properties and excellent thermal conductivity capability.
4. Large metallic thermal columns that run through the 'domed envelope region' for the purpose of extracting heat from this region and channeling it to the upper surface of the integrated circuit structure for removal.
5. Large inorganic support blocks placed within the 'domed envelope region' directly beneath bonding pads (which are located on the upper surface) for the purpose of providing mechanical integrity during the external wire bonding application.
6. A method of efficiently extracting the sacrificial (polymer) material from the 'domed envelope region' by using a metallic 'vapor block'. This 'vapor block', after used to extract the sacrificial material, is altered to become a thermal metallic column in the end product (see item 4 above).
7. Multilevel conductors are fabricated in the 'dome' layer using state-of-the-art duel-damascene processing techniques. The inorganic 'dome' layer has a higher dielectric constant, however, for upper layer conductors the conductor size is somewhat large and the spacing between conductors can be increased considerably so as to minimize the capacitive coupling between these conductors.

Moreover, conventional low-k/copper dual damascene processes can be utilized to realize this multilevel interconnect structure having an effective (gas) dielectric constant of near unity, resulting in a substantial interconnect capacitance reduction for tightly spaced metal lines. Also, no organic dielectric materials (and their associated reliability problems) are included in the final multilayer structure.

BRIEF DESCRIPTION OF THE DRAWINGS

Other advantages of the present invention will be readily appreciated as the same becomes better understood by reference to the following detailed description when considered in connection with the accompanying drawings wherein.

DESCRIPTION OF THE PREFERRED EMBODIMENT

Referring to the Figures, wherein like numerals indicate like or corresponding parts throughout the several views, a method of fabricating electrical conductors for an integrated circuit (IC) having improved electrical properties is disclosed. More specifically, a method of providing an electrically insulating medium in an enclosed envelope which contains multilevel metal conductors of the integrated circuit is disclosed. If conductor levels within an enclosed envelope are embedded in a gas or liquid having a near unity dielectric constant, they must be supported in such a fashion as to maintain structural integrity. In this invention, metal conductors are held in place by a plurality of insulating structures (i.e., $SiO_2$) which extend upward from a base substrate. Properly designed, these conductors can be structurally sound without the need of continuous underlying support. To add strength to the suspended conductor runs, a thin layer of resilient material, either a conductor or an insulator, can be deposited on either the bottom or the top side of the conductor.

Figure 1:
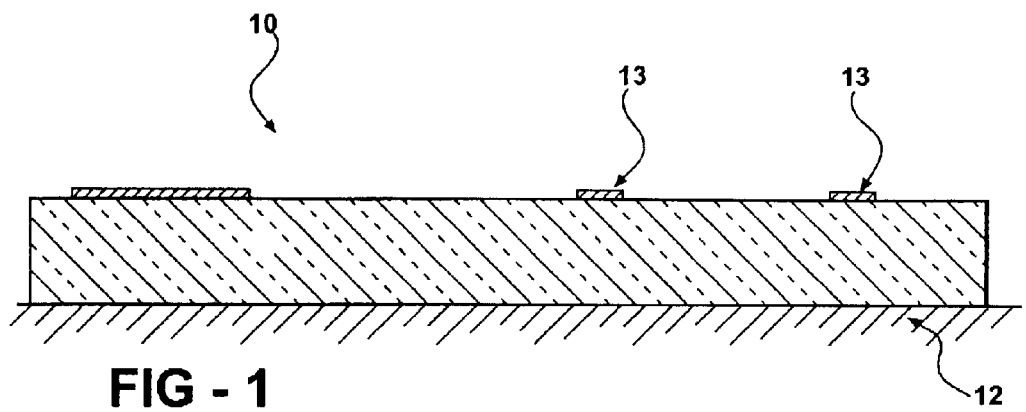
FIGS. 1 through 18 are perspective sectional views showing various steps in the method of producing a structure according to this invention.

As shown in FIG. 1, insulating substrate material 10 such as $SiO_2$ is provided which may overlie the devices embedded in a substrate 12 of a VLSI or ULSI integrated circuit chip (devices not shown). The insulating material 10 has deposited thereon a masking layer such as silicon nitride 13 which has been patterned by conventional photolithographic techniques to provide the desired masking structure on top of this insulating substrate layer 10.

Figure 2:
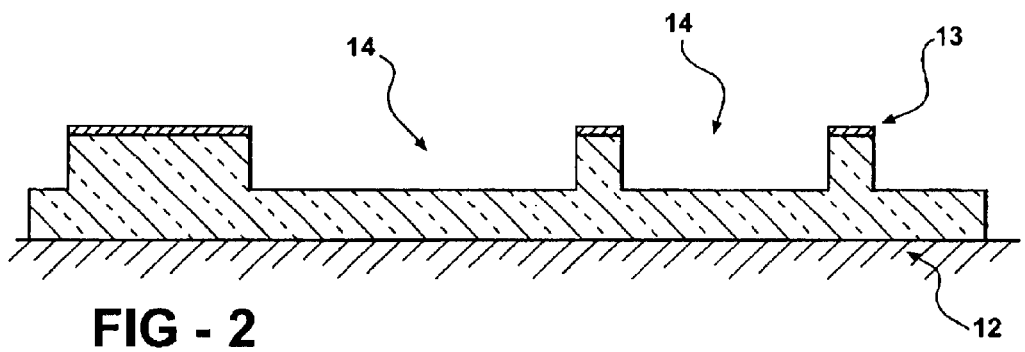

The layer 10 is then etched using dry plasma etching techniques everywhere except under the masking material 13 to form channels 14 as shown in FIG. 2. The depth of the etched channels 14 is adjusted so as to equal the desired thickness for the first level conductor (to be described).

Figure 3:
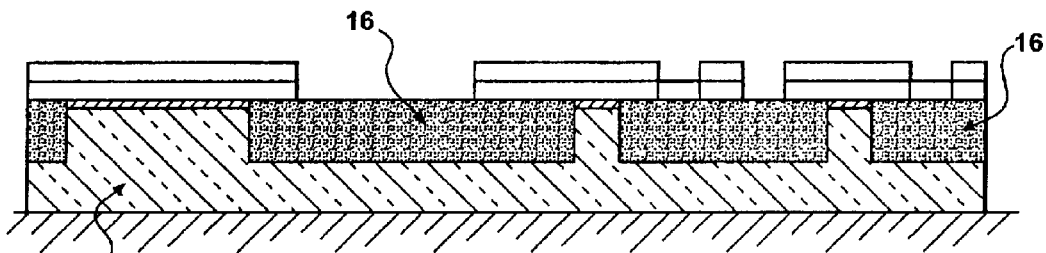

Referring now to FIG. 3, a layer of removable material 16 is deposited on the substrate material 10 to a thickness that exceeds the channel depth 14. This removable material 16 is utilized as a temporary support structure in realizing the gas dome dielectric system's conductor/insulator elements and is then removed by vaporizing. The removable material 16 can be any material which has the properties of being etched or consumed at a rate significantly and substantially faster than any of the material surrounding it (i.e., metal conductors and inorganic insulators like $SiO_2$). The removable material 16 must also be compatible with ULSI integrated circuit processing. Candidates include polymers having a low thermal decomposition temperature, Tg. Preferred materials include polyimides (an organic polymer sold by a number of companies including Dupont Corp., Hitachi Inc., etc.), parylene N (a poly-para-xylylene polymer sold by Union Carbide Corp. and others), a spin-on-glass or a norbornene-type polymer.

These materials can be readily selectively removed under certain specific conditions as will be described presently. If polyimide is used, it can be deposited by spin coating to any desired thickness depending on the spin speed and the viscosity of the liquid precursor. This is followed by a typical thermal curing cycle. If parylene is used, it can be deposited by chemical vapor deposition (CVD) techniques which are well known in the art. Many of the polymeric materials require an adhesion promoter (such as A1100 sold by Shipley Co.) to be first applied to the substrate. When the material is deposited, it is planarized by a suitable technique such as etch back, chemical-mechanical-polishing (CMP), or other planarization techniques so that the top surface is flush with the top of the substrate surface 10 shown in FIG. 3.

Figure 4:
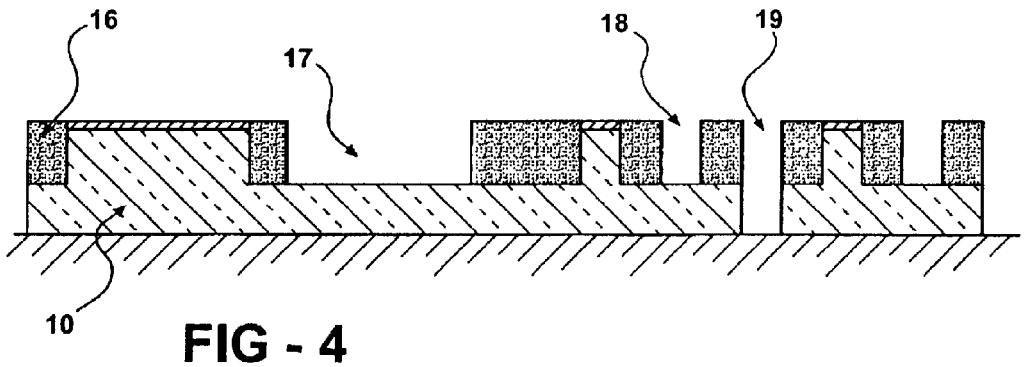

Next, a dual damascene etch process is undertaken whereby a double layer photoresist masking material is deposited (and cured) over the entire structure as shown in FIG. 3. In this process, two etching steps are undertaken utilizing the same (or similar) masking material. Referring now to FIG. 4, the first etch occurs (in the absence of photoresist) at channel 19 (where a metal contact to an active device in the substrate 12 is to occur) such that a portion of this channel material is removed. Then the second etch (after the etching substance erodes the thin photoresist layer) forms channels 17, 18 and completes the formation of channel 19 as shown in FIG. 4.

Figure 5:
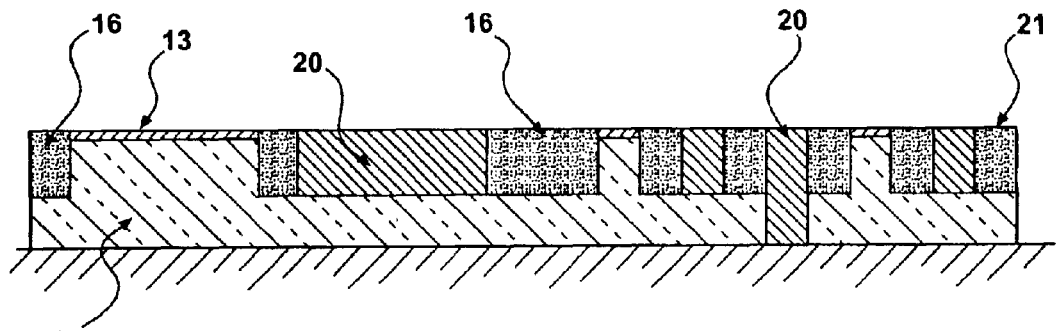

Referring now to FIG. 5, this is followed by first level metal 20 being deposited over the entire wafer. The preferred metal is copper which is typically deposited by electroplating. Prior to bulk metal deposition, a thin barrier/liner material is deposited (i.e., TaN) followed by a copper seed layer using CVD techniques. This metal layer is then planarized to the top surface 21 using chemical-mechanical-polishing methods, resulting in a profile as shown in FIG. 5. The metal conductor region 20 shown here is the first level metal of a multilevel metal system.

Figure 6:
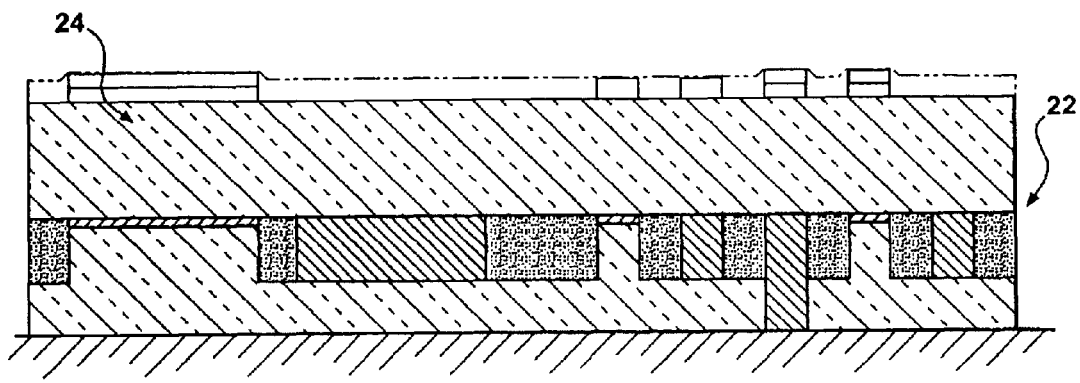
Figure 7:
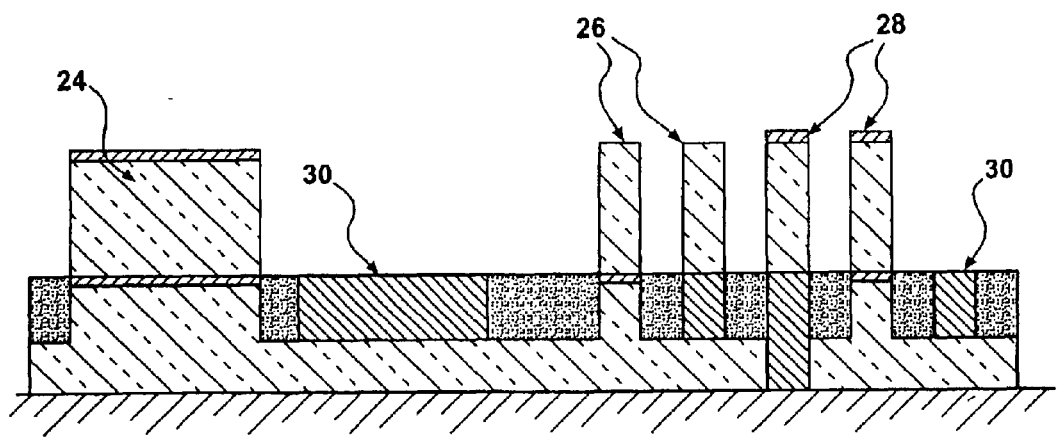

A very thin insulating stop layer 22 (silicon nitride) is next deposited as shown in FIG. 6 followed by the deposition of a thick silicon dioxide layer 24 (typically using a high density plasma (HDP) CVD $SiO_2$). Many of the steps used in forming the first level conductor structure are next repeated to form higher and higher levels. Again, an insulating hard masking layer is deposited (silicon nitride) and patterned using conventional photolithographic processing to yield the structure shown atop of FIG. 6. A photoresist layer is deposited, patterned and used as a mask to etch the thick oxide as shown in FIG. 7 thereby forming channels 30. Notice, the early formation of the plurality of stanchions 26 and 28 which will be used to support metal conductors.

Figure 8:
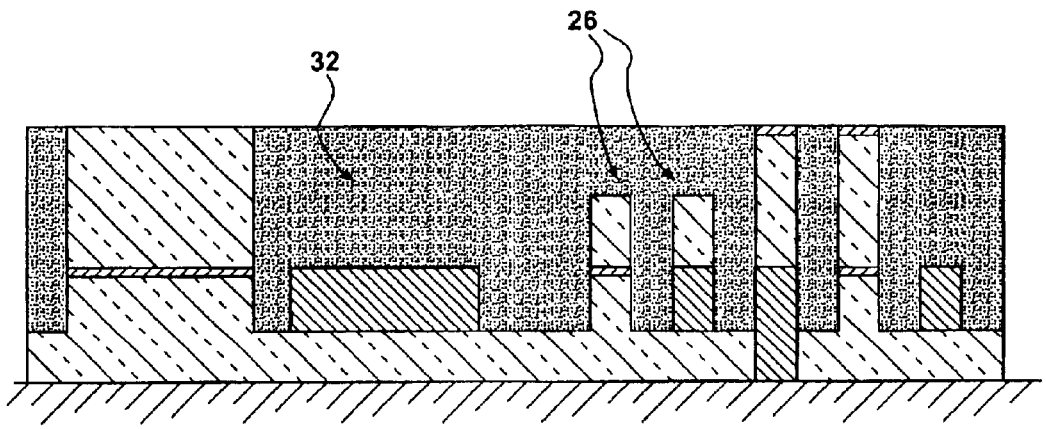
Figure 9:
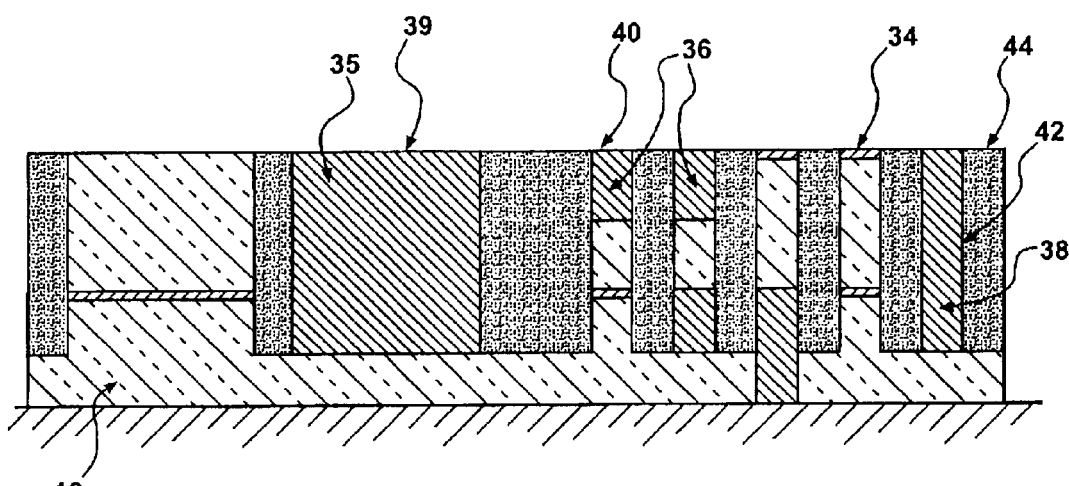

Referring now to FIGS. 8 and 9, the photoresist mask is removed and the wafer exposed to a plasma etch environment, thereby reducing the height of stanchions 26 below the upper surface a distance equal to the desired thickness of the second level metal. Structures 28 are not etched due to the presence of the hard mask (silicon nitride). This difference in height is shown in FIG. 8. The etch stop in layer 22 is removed from the bottom of channel 30 and a second layer of removable material 32 is deposited and planarized (FIG. 8). As illustrated compoundly, the second polymer layer 32 is next patterned for second level metal trenches 35 and 36 and first to second level metal vias, or holes, 38. Also included is the filling of the second layer trenches 35, 36 and 38 with a second metal layer 39, 40 and 42. This is followed by planarizing the second top surface 34 and applying a second thin stop layer 44 over the second top surface 34 shown in FIG. 9.

Figure 10:
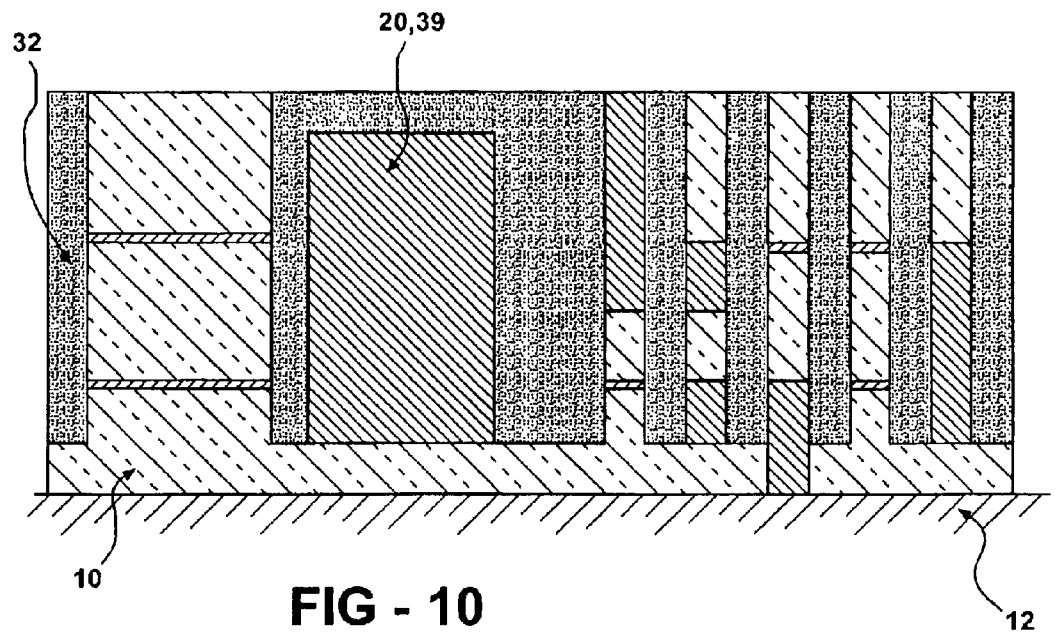
Figure 11:
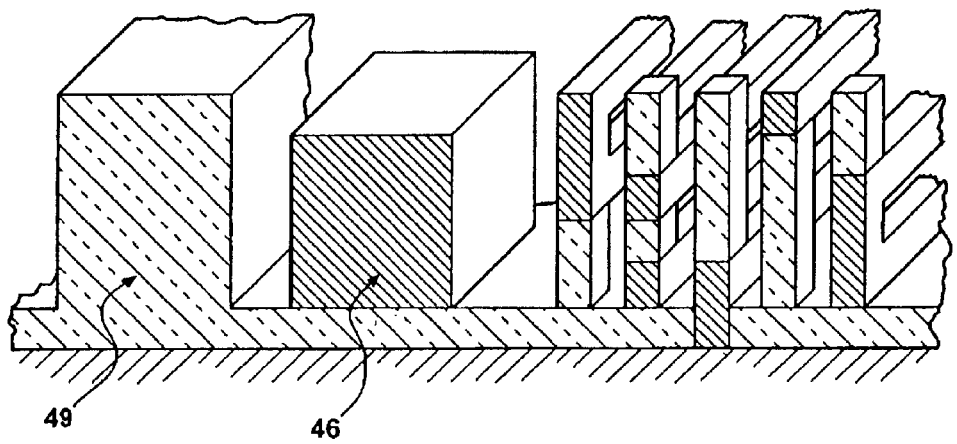

The same processing steps used to form the first level metal M1 and the second metal level M2 are followed in depositing the third level metal M3 and the second to third level metal vias as shown in FIG. 10. (Note that a double deposition process is required to adjust the height of the metal 'vapor block' 39.). A three dimensional representation of the three layer electrical structure (as processed in this illustration) is shown in FIG. 11, but with the polymer dielectric material excluded. This figure illustrates how the metal conductors are supported by the plurality of insulating stanchions.

Simultaneously with the layering up of the conductor and insulating levels, a 'metallic vapor block' 46 and an 'inorganic support block' 49 are formed and filled with the metal layers 20 and 39 and insulator layers 10 and 24 and surrounded by the removable material 16 and 32 as shown in FIG. 11.

Figure 12:
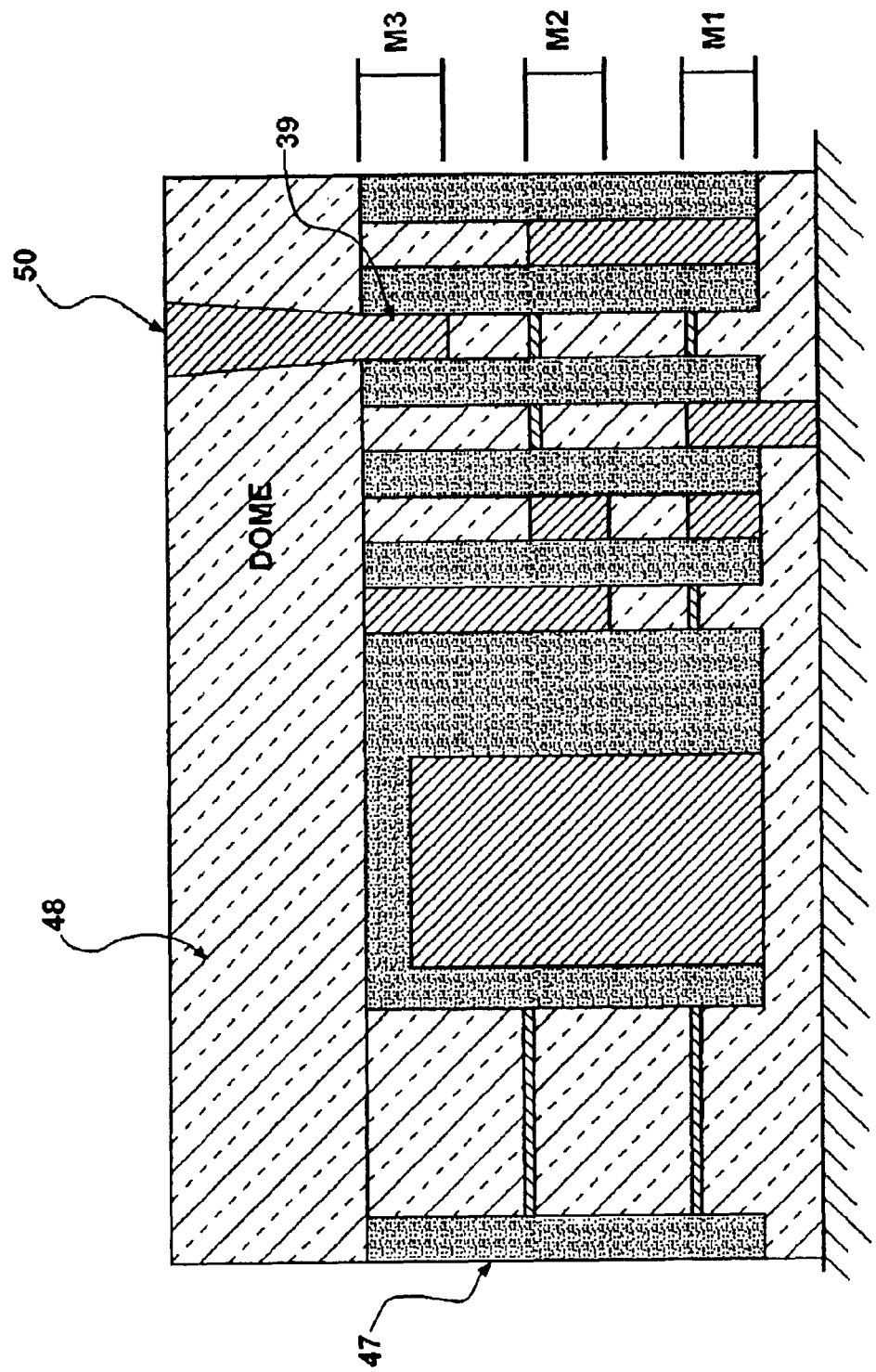

Referring now to FIG. 12, the next step is to deposit a thin etch stop layer (silicon nitride) 47 followed by a very thick and dense oxide layer 48 which will act as the 'dome' layer for all underlying layers. Also included is the step of etching a via, or hole, through the dome layer 48 to one of the metal layers 39. The vias through the dome layer 48 provide electrical connection from the metal layer below the dome (M3) to the metal layer above the dome 48. The vias are filled with metal 50 to provide an electrical connection and planarized. Therefore the method includes the step of disposing a dome layer 48 of a dielectric insulator over the last layer, the last layer being dependent upon the number of conductor levels desired-M1, M2, M3, M4, etc.

Figure 13:
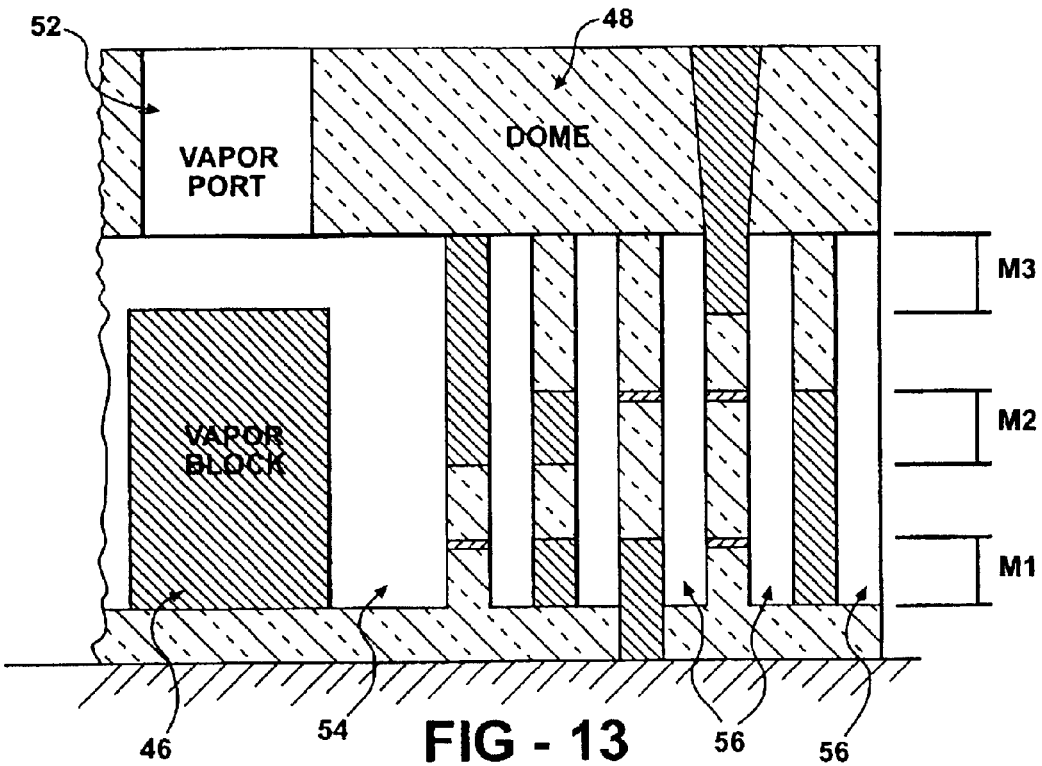

Referring now to FIG. 13, utilizing conventional photolithographic patterning techniques, vapor ports 52 are etched into the dome 48 to access the removable material surrounding the vapor block 46. The large vapor ports 52 are formed in the dome layer 48 directly above the metallic vapor blocks 20, 39 exposing the low Tg polymer removable material.

One method to extract the removable material includes the step of heating the removable material to vaporize the polymer through the vapor port 52 and leave gas pockets 54 and 56 adjacent to the metal layers, as illustrated in FIG. 13. In the presence of a vacuum, this structure can be heated from the top-side (i.e., using quartz lamps) to a temperature far exceeding the decomposition temperature, $T_g$, of the removable polymer material causing it to vaporize (ash) through the 'vapor ports' 52. Applying heat to the topside of the wafer causes the metal 'vapor block' 20, 39 to heat up first, thus vaporizing the removable polymer material around it. Since the dome layer 48 heats faster than the silicon substrate, the top removable polymer material layers will tend to vaporize before the lower layers, resulting in an orderly vaporization of all polymer material. If a parylene material is used, it can be easily removed by heating the structure in an $O_2$ rich atmosphere at a temperature above 200° C. causing the parylene to turn to gas and be expelled.

The vacated enclosed envelope must next be back filling with a desired dielectric gas or liquid thereby filling pockets

Figure 14:
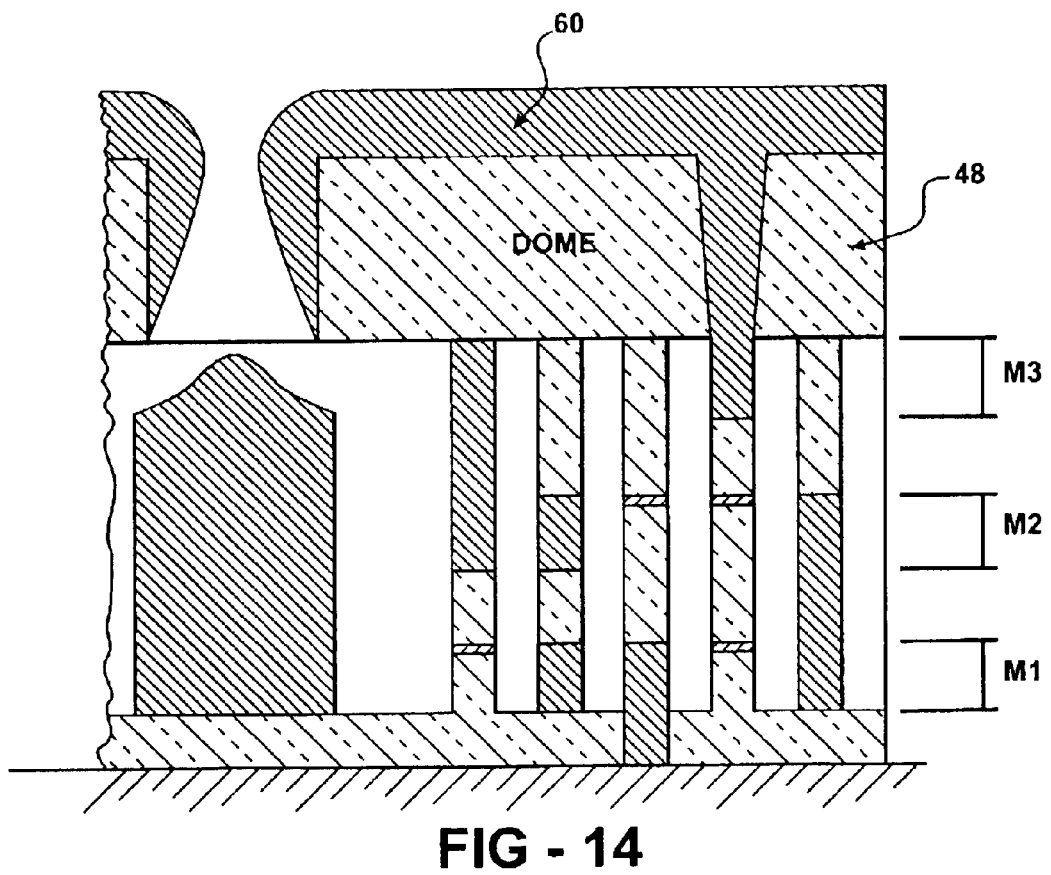
Figure 15:
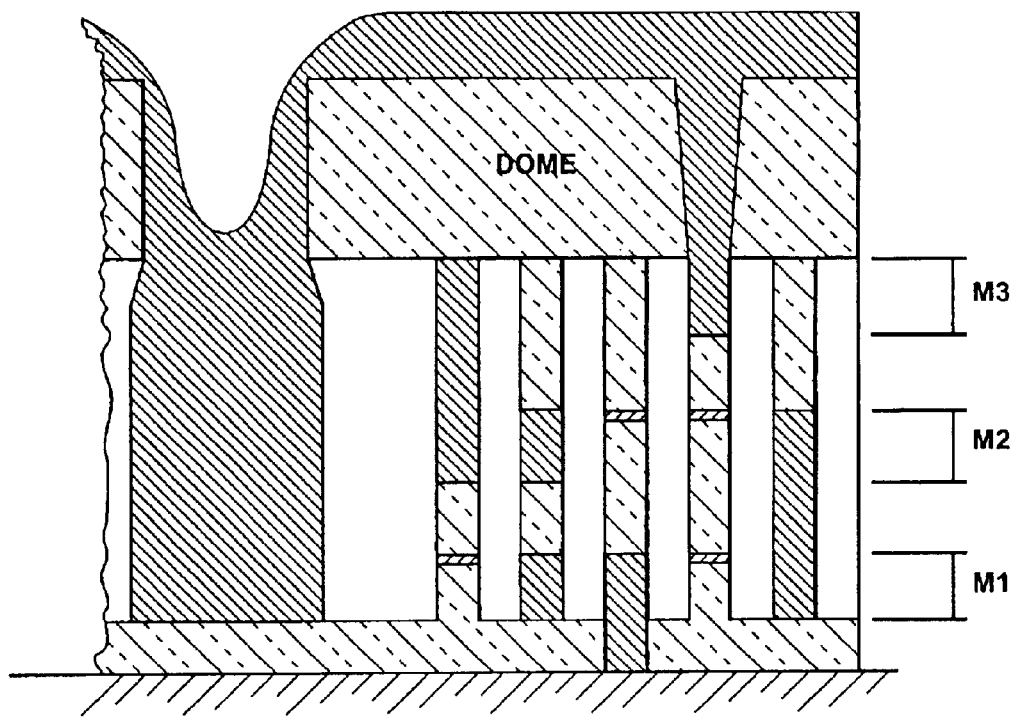
Figure 16:
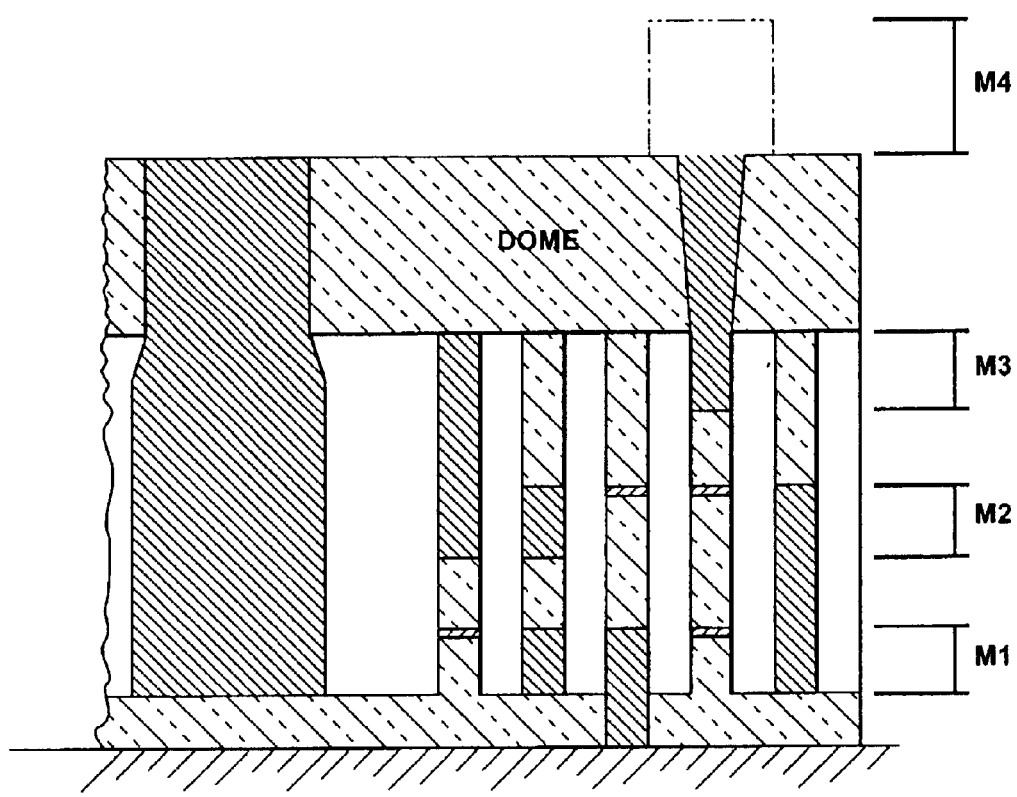

54 and 56. Finally, the vapor port 52 must be sealed. For purposes of thermal conduction, light molecular gases like hydrogen or helium are the most desirable dielectric gases. One methodology for capping the 'vapor port' 52 is illustrated in FIG. 14 where a thick metal layer 60 is deposited under vacuum on top of the insulating dome layer 48, the thickness selected in such a manner as to almost completely fill the vapor port 52. The vacuum chamber is then backfilled with the desired dielectric gas to a pressure at or above atmospheric pressure and the metal around each 'vapor port' 52 is spot welded, as with a laser, in such a fashion as to cause the metal 60 to flow into the vapor port 52 closing it as shown in FIG. 15. With the gas dielectric trapped inside, complete filling of the vapor port 52 and planarization can be accomplished as shown in FIG. 16.

In dielectric gases, the molecules themselves conduct heat; thus gases with lighter and faster molecules (e.g. helium) are better heat conductors than heavier gases (e.g. air). Obviously, the more concentrated the gas, the better the thermal conductivity. Therefore, trapping gases whose internal pressure is greater than that of atmospheric pressure will greatly assist in thermal conduction of heat. And, as mentioned above, insulating liquids are also candidates for dielectrics in the dome envelope region. Several liquids have excellent dielectric constants (i.e., alkyl benzene-2.1, fluorocarbon $C_8F_{16}O$-1.8, etc.) as well as thermal conductivities which are much higher than any of the gas candidates. In addition, new insulating liquids are currently under development.

Figure 17:
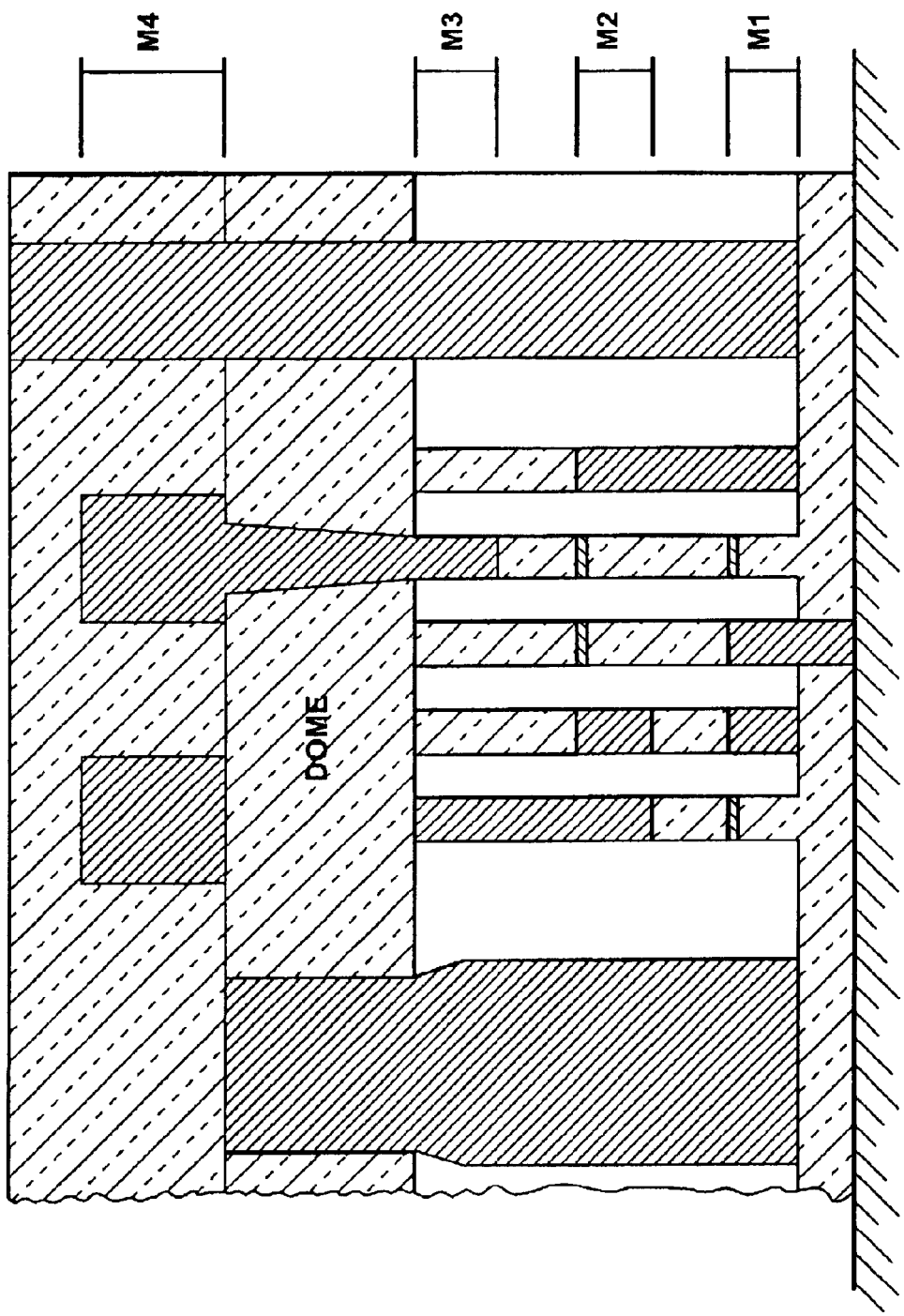

In order to extract heat from the gas dome envelope system, high thermal conduction paths must be introduced in the form of metallic columns—as shown in FIG. 17—where possible. The metal vapor block 46 also acts as a thermal metallic column upon process completion. Also, the possibility of introducing metal in portions of the dome layer (away from vias, etc.) would assist in removing heat.

Just as large metal vapor block structures can be realized as the metal layers are built up, it is also possible to realize large ($SiO_2$) dielectric block structures from the bottom to the top of the enclosed dome structure. These dielectric block structures provide added structural integrity to the 'dome', over which bonding pads can be placed.

Figure 18:
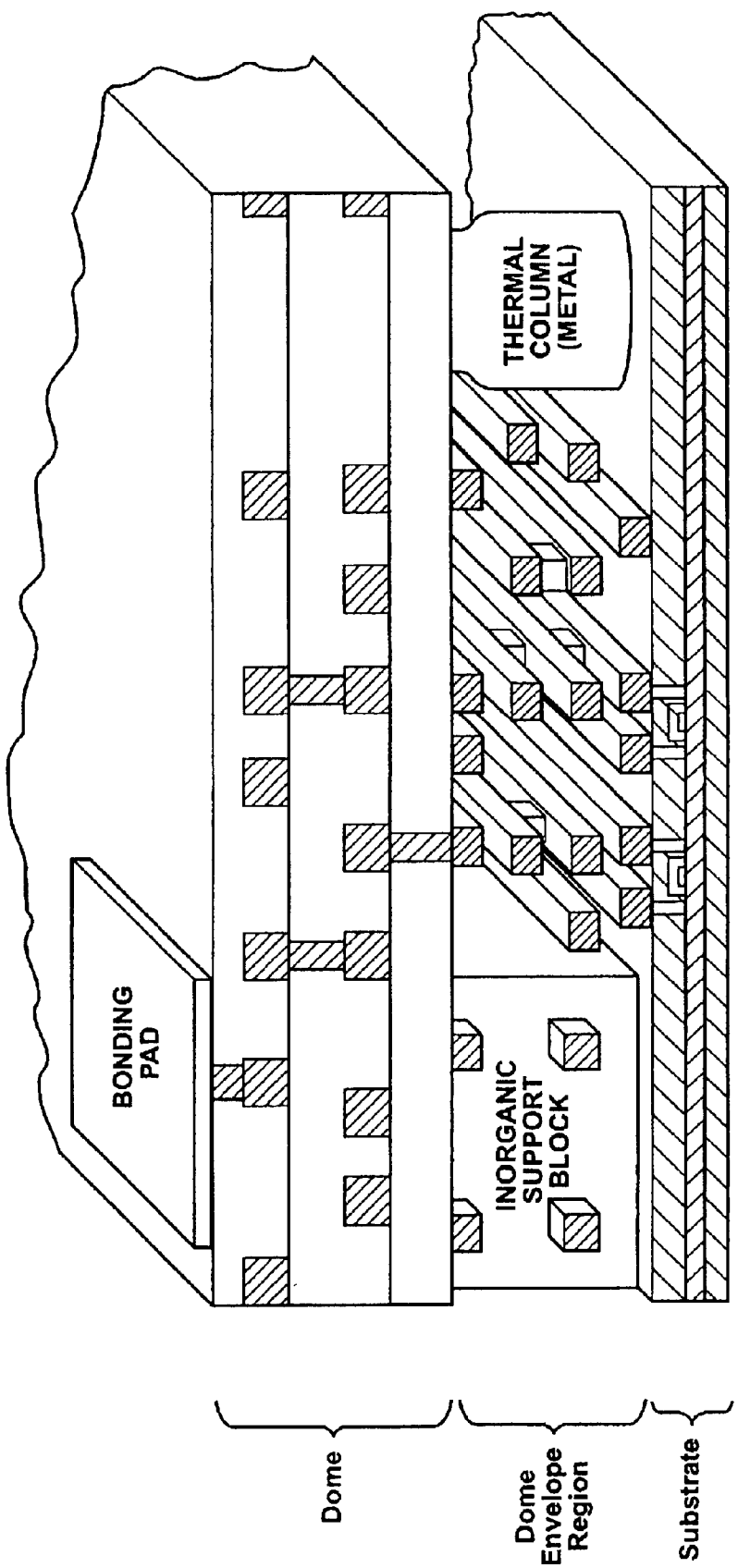

FIG. 18 illustrates a three-dimensional drawing of the Gas Dome Dielectric System of the subject invention.

Accordingly, the subject invention provides a near unity-k gas dome dielectric system (GDDS) which utilizes a light molecular gas having good electrical properties for its interlayer and intralayer dielectric material. The method utilizes only current technologies and is, therefore, easily realizable. The final structure incorporates only high conductivity metal (Cu or Al) and inorganic dielectric materials (silicon oxides/nitrides), thereby eliminating the reliability issues associated with most low-k organic/inorganic materials. Thermal conductance for the gas dome region should be comparable with those of most current low-k polymer materials, especially nano-pore materials. The subject invention provides a Gas Dome Dielectric System that can consist of a 'partial' dome whereby only the lower levels of tightly packed conductors are embedded in a the enclosed gas dielectric envelope (having k=1), or it can consist of a 'full' dome representation where all levels of conductors are embedded in a gas dielectric envelope. For purposes of process integration, reliability and thermal conductivity, the partial dome concept was demonstrated herein.

The invention has been described in an illustrative manner, and it is to be understood that the terminology which has been used is intended to be in the nature of words of description rather than of limitation. Obviously, many modifications and variations of the present invention are possible in light of the above teachings. It is, therefore, to be understood that within the scope of the appended claims, the invention may be practiced otherwise than as specifically described.

What is claimed is:

1. A method of providing an electrically insulating medium in an enclosed envelope which contains multilevel metal conductors of an integrated circuit, said method comprising the steps of:
    providing a base substrate of insulating material;
    forming a plurality of discrete multilevel metal conductors on and above the base substrate;
    forming a plurality of discrete support means extending upwardly from the base substrate to one or more conductor levels or between conductor levels;
    depositing a selectively removable material on the base substrate and around the support means and the metal conductors;
    providing a dome layer of insulating material overlying the support means, the conductor levels, and the removable material;
    forming access opening means in the dome layer communicating with the removable material;
    removing the removable material through the access opening means without interrupting the base substrate, the dome layer, the support means, and the metal conductors thereby defining the envelope between the base substrate and the dome layer and around the support means and the metal conductors such that the envelope is filled with a low dielectric constant material; and
    sealing the access opening means with conducting or insulating material.

2. The method as set forth in claim 1 wherein the support means comprise a plurality of stanchions formed by an insulating material.

3. The method as set forth in claim 1 further comprising the step of depositing a low dielectric constant gas or liquid in the envelope after the removable material is removed.

4. The method as set forth in claim 1 wherein the support means comprise metal blocks extending from the base substrate at least partially into the dome layer to promote thermal conduction.

5. The method as set forth in claim 1 wherein the support means comprise solid insulating material blocks extending from the base substrate to the dome layer for providing mechanical integrity to bonding pads.

6. The method as set forth in claim 1 wherein the step of sealing the access opening means with conducting or insulating material is further defined as filling the access opening means with a metal.

7. The method as set forth in claim 1 further comprising the step of forming additional multilevel metal conductors on and above the dome layer and surrounded by insulating material.

8. The method as set forth in claim 1 wherein the base substrate and the dome layer comprise silicon dioxide.

9. The method as set forth in claim 1 further comprising the steps of forming contact hole openings in the base substrate layer and filling the contact hole openings with a metal.

10. The method as set forth in claim 1 wherein the metal conductors comprise a metal selected from the group of copper, aluminum, gold, silver, and combinations thereof.

11. The method as set forth in claim 1 wherein the removable material comprises a polymer selected from the group of polyimides, parylenes, spin-on-glass type polymers, norbornene type polymers, and combinations thereof.

12. The method as set forth in claim 2 wherein the plurality of stanchions are formed by deposition and selective etching of insulating materials.

13. The method as set forth in claim 12 wherein the plurality of stanchions are formed with silicon dioxide.

14. The method as set forth in claim 5 wherein metal conductor lines pass through the solid insulating material blocks.

15. The method as set forth in claim 3 wherein the step of depositing the low dielectric constant gas or liquid in the envelope is further defined as depositing a low dielectric constant gas in the envelope such that an internal pressure of the low dielectric constant gas is at, below, or above atmospheric pressure and a dielectric constant of the low dielectric constant gas is near unity.

16. The method as set forth in claim 7 further comprising the step of forming metal bonding pads on an uppermost surface of the insulating material which are electrically connected to one or more of the metal conductors within the insulating material.

17. The method as set forth in claim 10 wherein the metal conductors are formed using dual damascene processes.

* * * * *